US012812995B2

(12) United States Patent
Ishino

(10) Patent No.: US 12,812,995 B2
(45) Date of Patent: Nov. 24, 2026

(54) PHOTOELECTRIC CONVERSION APPARATUS AND METHOD OF MANUFACTURING THE SAME

(71) Applicant: CANON KABUSHIKI KAISHA, Tokyo (JP)

(72) Inventor: Hideaki Ishino, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 704 days.

(21) Appl. No.: 17/895,101

(22) Filed: Aug. 25, 2022

(65) Prior Publication Data

US 2023/0074553 A1 Mar. 9, 2023

(30) Foreign Application Priority Data

Sep. 3, 2021 (JP) ................................ 2021-144167

(51) Int. Cl.
*H01L 27/146* (2006.01)
*H10F 39/00* (2025.01)

(52) U.S. Cl.
CPC ....... *H10F 39/8057* (2025.01); *H10F 39/024* (2025.01)

(58) Field of Classification Search
CPC ............... H10F 39/8057; H10F 39/024; H10F 39/12–199; H10F 39/807; H10F 39/802–80377
See application file for complete search history.

(56) References Cited

U.S. PATENT DOCUMENTS

| | | | | |
|---|---|---|---|---|
| 7,294,873 | B2 | 11/2007 | Suzuki et al. | |
| 10,529,764 | B2 | 1/2020 | Kobayashi et al. | |
| 10,804,304 | B2 | 10/2020 | Noh et al. | |
| 11,276,723 | B2 | 3/2022 | Ogino et al. | |
| 2018/0294305 | A1* | 10/2018 | Janssens | H10F 39/199 |
| 2019/0252425 | A1* | 8/2019 | Ogawa | H10F 39/811 |
| 2020/0066769 | A1* | 2/2020 | Kurihara | H10F 39/8037 |

(Continued)

FOREIGN PATENT DOCUMENTS

| | | |
|---|---|---|
| JP | 2003-031785 A | 1/2003 |
| JP | 2019-125784 A | 7/2019 |

(Continued)

OTHER PUBLICATIONS

Office Action dated Jun. 6, 2025, in Japanese Patent Application No. 2021-144167.

*Primary Examiner* — Steven B Gauthier
*Assistant Examiner* — Rhys Poniente Sheker
(74) *Attorney, Agent, or Firm* — Venable LLP

(57) ABSTRACT

An apparatus comprising a semiconductor arranged with a pixel region and a shielding region is provided. The shielding region includes a first region having first and second trenches and a second region arranged between the first region and the pixel region. The first trench extends from a first surface of the semiconductor toward a second surface of the semiconductor and the second trench extends from the second surface toward the first surface. (D/2)≤(T1, T2)<D is satisfied, where T1 and T2 are depth of the first and second trenches and D is a thickness of the semiconductor. The first and second trenches are arranged apart from each other, and the first and second trenches overlap at least partly in an orthogonal projection with respect to a boundary surface between the first and second regions.

17 Claims, 9 Drawing Sheets

(56) References Cited

U.S. PATENT DOCUMENTS

| | | | | |
|---|---|---|---|---|
| 2020/0243582 | A1* | 7/2020 | Li | H01L 21/76224 |
| 2021/0118924 | A1 | 4/2021 | Tamaki et al. | |
| 2022/0149089 | A1* | 5/2022 | Khang | H10F 39/182 |
| 2022/0293457 | A1* | 9/2022 | Chou | H10F 39/806 |

FOREIGN PATENT DOCUMENTS

| | | | |
|---|---|---|---|
| JP | 2020-031136 | A | 2/2020 |
| JP | 2021-040166 | A | 3/2021 |
| JP | 2021-068788 | A | 4/2021 |
| WO | 2015/068589 | A1 | 5/2015 |

* cited by examiner

PHOTOELECTRIC CONVERSION APPARATUS AND METHOD OF MANUFACTURING THE SAME

BACKGROUND OF THE INVENTION

Field of the Invention

The present invention relates to a photoelectric conversion apparatus and a method of manufacturing the same.

Description of the Related Art

There is known a photoelectric conversion apparatus including a pixel region in which a plurality of pixels including photoelectric conversion elements are arranged in an array and a light-shielding region. Japanese Patent Laid-Open No. 2003-031785 discloses a solid-state image capturing device having a peripheral circuit portion light-shielded by a light-shielding film.

SUMMARY OF THE INVENTION

The arrangement disclosed in Japanese Patent Laid-Open No. 2003-031785 can shield light vertically incident on the light-shielding film. However, light obliquely incident on an end portion of the light-shielding film or light incident from an end portion of a chip can become stray light, which propagates in a portion of the substate which corresponds to the light-shielding region light-shielded by the light-shielding film. Assume that stray light is photoelectrically converted by optical black pixels arranged in the light-shielding region and that stray light intrudes the pixel region and is photoelectrically converted by pixels arranged in the pixel regions. In this case, the obtained image can deteriorate in quality.

Some embodiments of the present invention provide a technique advantageous in suppressing a reduction in image quality.

According to some embodiments, a photoelectric conversion apparatus comprising a semiconductor layer arranged with a pixel region including a plurality of photoelectric conversion elements and a light-shielding region light-shielded by a light-shielding layer, wherein the light-shielding region includes a first light-shielding region having a first trench structure and a second trench structure provided in the semiconductor layer and a second light-shielding region arranged between the first light-shielding region and the pixel region, the semiconductor layer includes a first surface and a second surface on an opposite side to the first surface, the first trench structure extends from the first surface toward the second surface, the second trench structure extends from the second surface toward the first surface, relations of $(D/2) \leq T1 < D$ and $(D/2) \leq T2 < D$ are satisfied, where T1 is a depth from the first surface of the first trench structure, T2 is a depth from the second surface of the second trench structure, and D is a thickness of the semiconductor layer, the first trench structure and the second trench structure are arranged apart from each other in an orthogonal projection with respect to the first surface, and the first trench structure and the second trench structure overlap at least partly in an orthogonal projection orthogonal to the first surface and provided with respect to a virtual surface along a boundary between the first light-shielding region and the second light-shielding region, is provided.

According to some other embodiments, a method of manufacturing a photoelectric conversion apparatus including a semiconductor layer arranged with a pixel region including a plurality of photoelectric conversion elements and a light-shielding region light-shielded by a light-shielding layer, the method comprising: forming a first trench structure extending from a first surface of the semiconductor layer toward a second surface on an opposite side to the first surface; and forming a second trench structure extending from the second surface toward the first surface, wherein the light-shielding region includes a first light-shielding region having the first trench structure and a second trench structure provided in the semiconductor layer, and a second light-shielding region provided between the first light-shielding region and the pixel region, relations of $(D/2) \leq T1 < D$ and $(D/2) \leq T2 < D$ are satisfied, where T1 is a depth from the first surface of the first trench structure, T2 is a depth from the second surface of the second trench structure, and D is a thickness of the semiconductor layer, the first trench structure and the second trench structure are arranged apart from each other in an orthogonal projection with respect to the first surface, and the first trench structure and the second trench structure overlap at least partly in an orthogonal projection orthogonal to the first surface and provided with respect to a virtual surface along a boundary between the first light-shielding region and the second light-shielding region, is provided.

Further features of the present invention will become apparent from the following description of exemplary embodiments (with reference to the attached drawings).

DESCRIPTION OF THE EMBODIMENTS

Figure 1:
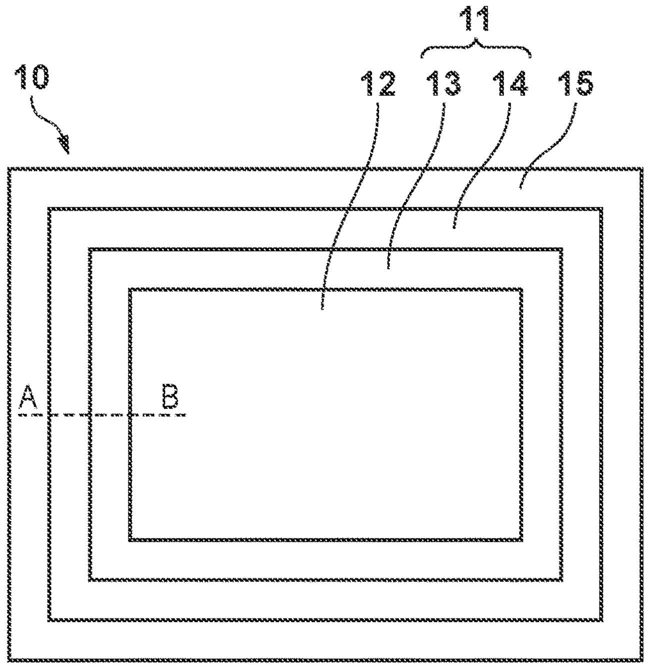
FIG. 1 is a plan view showing an example of the arrangement of a photoelectric conversion apparatus according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 2:
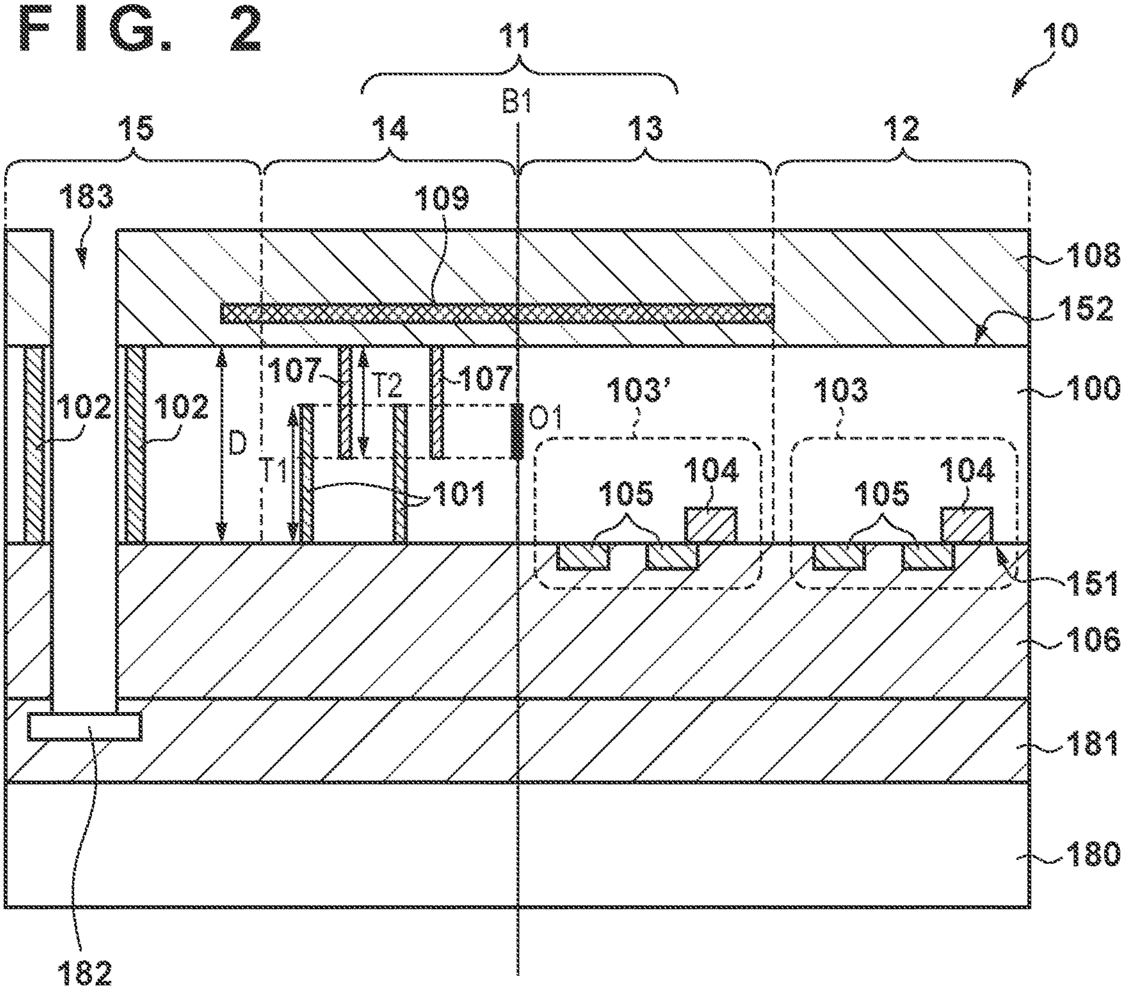
FIG. 2 is a sectional view showing an example of the arrangement of the photoelectric conversion apparatus in FIG. 1.

A photoelectric conversion apparatus according to an embodiment of this disclosure will be described with reference to FIGS. 1 to 10B. FIG. 1 is a plan view showing the schematic arrangement of a photoelectric conversion apparatus 10 according to this embodiment. FIG. 2 is a sectional view taken along A-B in FIG. 1.

As shown in FIGS. 1 and 2, the photoelectric conversion apparatus 10 includes a semiconductor layer 100 arranged with a pixel region 12 having a plurality of photoelectric conversion elements 103 and a light-shielding region 11 light-shielded by a light-shielding layer 109. The semiconductor layer 100 includes two principal surfaces, namely, a surface 151 and a surface 152 on the opposite side to the surface 151. The light-shielding region 11 includes a first light-shielding region 14 having first trench structures 101 and second trench structures 107 provided in the semiconductor layer 100 and a second light-shielding region 13 provided between the first light-shielding region 14 and the pixel region 12. The semiconductor layer 100 may be further arranged with a peripheral region 15, at least part of which is not covered with a light-shielding layer 109, between the end portion of the semiconductor layer 100 and the second light-shielding region 13. However, the semiconductor layer 100 is not limited to this and may be covered with the light-shielding layer 109 up to the end portion of the semiconductor layer 100.

In this embodiment, as shown in FIGS. 1 and 2, in an orthogonal projection with respect to the surface 151, the pixel region 12 can be a rectangular region provided in a central portion of the semiconductor layer 100. In the pixel region 12, the plurality of photoelectric conversion elements 103 can be arranged in an array so as to form rows and columns. In an orthogonal projection with respect to the surface 151, the second light-shielding region 13 is arranged so as to surround the pixel region 12, and the second light-shielding region 13 also has a rectangular outer shape. In addition, the first light-shielding region 14 is arranged so as to surround the second light-shielding region 13 and also has a rectangular outer shape in an orthogonal projection with respect to the surface 151. Likewise, in an orthogonal projection with respect to the surface 151, the peripheral region 15 is arranged so as to surround the first light-shielding region 14 and includes the end portion of the semiconductor layer 100. In this embodiment, the semiconductor layer 100 has a rectangular shape in plan view.

In this embodiment, the photoelectric conversion apparatus 10 is a so-called backside illuminated type photoelectric conversion apparatus that has a plurality of photoelectric conversion elements arranged on the surface 151 of the semiconductor layer 100 and receives light from the surface 152 side of the semiconductor layer 100. Accordingly, the light-shielding layer 109 is arranged so as to cover part of the surface 152 of the semiconductor layer 100. Assume that the semiconductor layer 100 has a thickness D. As described above, the first trench structures 101 and the second trench structures 107 are provided in the first light-shielding region 14 of the semiconductor layer 100. The first trench structure 101 extends from the surface 151 of the semiconductor layer 100 toward the surface 152. The second trench structure 107 extends from the surface 152 toward the surface 151. In this case, the first trench structure 101 has a depth T1 from the surface 151, and the second trench structure 107 has a depth T2 from the surface 152. In this case, the depth T1 of the surface 151 of the first trench structure 101 is the distance between the surface 151 and a portion of the wall surface forming the first trench structure 101 which is located at the largest shortest distance from the surface 151. The depth T2 from the surface 152 of the second trench structure 107 is the distance between the surface 152 and a portion of the wall surface forming the second trench structure 107 which is located at the largest shortest distance from the surface 152. Typically, the depth T1 or T2 is the distance from the surface 151 or 152 as a reference to the bottom surface of the first trench structure 101 or the second trench structure 107 when its opening side is regarded as the upper side. In this case, the thickness D and the depths T1 and T2 satisfy the relations of $(D/2) \leq T1 < D$ and $(D/2) \leq T2 < D$. Although a detailed layout example will be described later, as can be understood from FIG. 2, in an orthogonal projection with respect to the surface 151 of the semiconductor layer 100, the first trench structures 101 and the second trench structures 107 are arranged apart from each other. In addition, in an orthogonal projection with respect to a virtual surface B1 that is orthogonal to the surface 151 of the semiconductor layer 100 and extends along the boundary between the first light-shielding region 14 and the second light-shielding region 13, the first trench structures 101 and the second trench structures 107 overlap each other at least partly. In other words, the thickness D and the depths T1 and T2 satisfy the relation of $D < (T1 + T2)$.

As described above, the first trench structures 101 and the second trench structures 107 each have a deep trench isolation (DTI) structure having a depth equal to or more than half the thickness of the semiconductor layer 100. The DTI structure can be a structure having an aspect ratio of 2 or more, which is obtained by dividing the depth of the trench by the width of the trench (the length in the widthwise direction). Alternatively, the DTI structure may have an aspect ratio of 5 or more, 7 or more, or 10 or more.

The interface between the first trench structure 101 and the semiconductor layer 100 or the interface between the second trench structure 107 and the semiconductor layer 100 may be provided with a semiconductor layer having a reverse polarity to the semiconductor layer 100. For example, polysilicon having a reverse polarity to the semiconductor layer 100 may be embedded in the interface between the first trench structure 101 or the second trench structure 107 and the semiconductor layer 100. Alternatively, epitaxial silicon may be formed in the interface. This can suppress the occurrence of dark noise at the interface between each of the first trench structures 101 and 107 and the semiconductor layer 100.

The photoelectric conversion elements 103 are arranged on the surface 151 of the semiconductor layer 100 in the pixel region 12. The photoelectric conversion element 103 can include a photodiode 104 and transistors 105 such as a transfer transistor, a reset transistor, a select transistor, and a source-follower transistor. The second light-shielding region 13 may also be arranged with photoelectric conversion elements 103' on the surface 151 of the semiconductor layer 100 separately from the photoelectric conversion elements 103 arranged in the pixel region 12. The photoelectric conversion element 103' may have an arrangement similar to that of the photoelectric conversion element 103 arranged in the pixel region 12. In the second light-shielding region 13, light incident on the photoelectric conversion apparatus 10 is shielded by the light-shielding layer 109 before reaching the photoelectric conversion element 103'. This arrangement can suppress the influence of dark noise by using the difference between the signals respectively output from the photoelectric conversion element 103 arranged in the pixel region 12 and the photoelectric conversion element 103' arranged in the second light-shielding region 13, thereby enabling accurate photographing. Although not shown, for example, a driving circuit for driving the photoelectric conversion element 103 arranged in the pixel region 12 may be arranged in the second light-shielding region 13. The driving circuit may drive the photoelectric conversion element 103' arranged in the second light-shielding region 13.

A structure 106 is arranged so as to cover the surface 151 of the semiconductor layer 100. The structure 106 can include a wiring pattern and a dielectric interlayer. The semiconductor layer 100 is joined to a support substrate 180 through the structure 106. As the support substrate 180, a silicon substrate having on its surface a structure 181 such as silicon oxide may be used. Alternatively, as the support substrate 180, a substrate loaded with an application specific integrated circuit (ASIC), a memory, and the like may be used. In this case, a wiring pattern, a dielectric interlayer, and the like may by arranged in the structure 181. In addition, when a substrate on which an ASIC, a memory, and the like are mounted is used as the support substrate 180, a bonding pad 182 for electrically connecting the photoelectric conversion apparatus 10 to an external device may be arranged in the peripheral region 15. In this case, an opening portion 183 for exposing the bonding pad 182 can be provided in the surface 152 of the semiconductor layer 100 so as to extend from the surface 152 toward the bonding pad 182. In the peripheral region 15, a pad separation trench structure 102 may be arranged in the semiconductor layer 100. The pad separation trench structure 102 functions as an insulating film that electrically isolates the opening portion 183 and the semiconductor layer 100.

A structure 108 is arranged so as to cover the surface 152 of the semiconductor layer 100. The structure 108 can include an optical structure for guiding light incident on the surface 152 of the semiconductor layer 100 to the photodiode 104. The structure 108 may be provided with, for example, an intra-layer lens, a color filter, a microlens, and the like as optical structures. In addition, a portion of the structure 108 which is located near the surface 152 of the semiconductor layer 100 is provided with the light-shielding layer 109 for setting the light-shielding region 11. In this embodiment, in an orthogonal projection with respect to the surface 151 of the semiconductor layer 100, the light-shielding layer 109 is arranged so as to cover the entire of the first light-shielding region 14 and the second light-shielding region 13 and part of the peripheral region 15. A material such as tungsten, aluminum, or titanium nitride can be used for the light-shielding layer 109.

In this case, as described above, in an orthogonal projection with respect to the virtual surface B1 that is orthogonal to the surface 151 of the semiconductor layer 100 and extends along the boundary between the first light-shielding region 14 and the second light-shielding region 13, an overlapping portion O1 is provided, where the first trench structures 101 and the second trench structures 107 partly overlap each other. The arrangement constituted by the first trench structures 101 and the second trench structures 107 which implement the overlapping portion O1 functions as a light attenuating wall for suppressing stray light from an end portion of the semiconductor layer 100 or a region of the peripheral region 15 which is not covered with the light-shielding layer 109 to the second light-shielding region 13. That is, this arrangement can prevent light incident from an end portion of the semiconductor layer 100 or the like from becoming stray light and being photoelectrically converted by the photoelectric conversion element 103' arranged in the second light-shielding region 13 and the photoelectric conversion element 103 arranged in the pixel region 12.

Figure 3A:
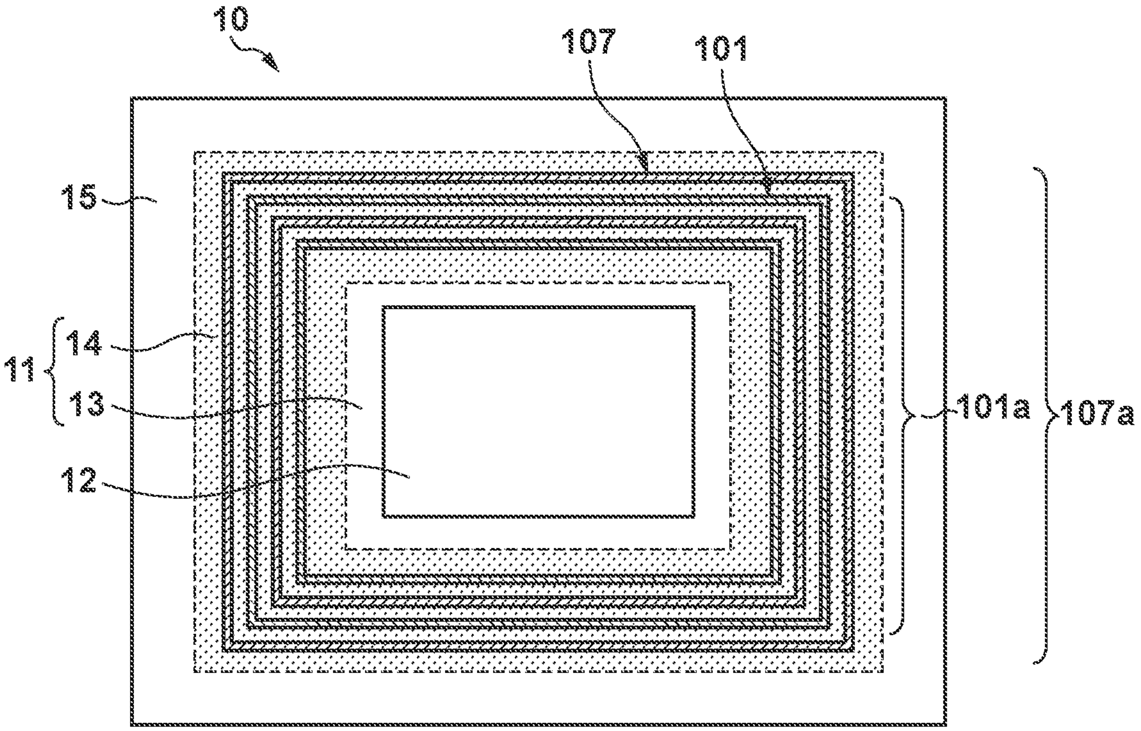
FIGS. 3A and 3B are views each showing a layout example of the trench structures of the photoelectric conversion apparatus in FIG. 1.
Figure 3B:
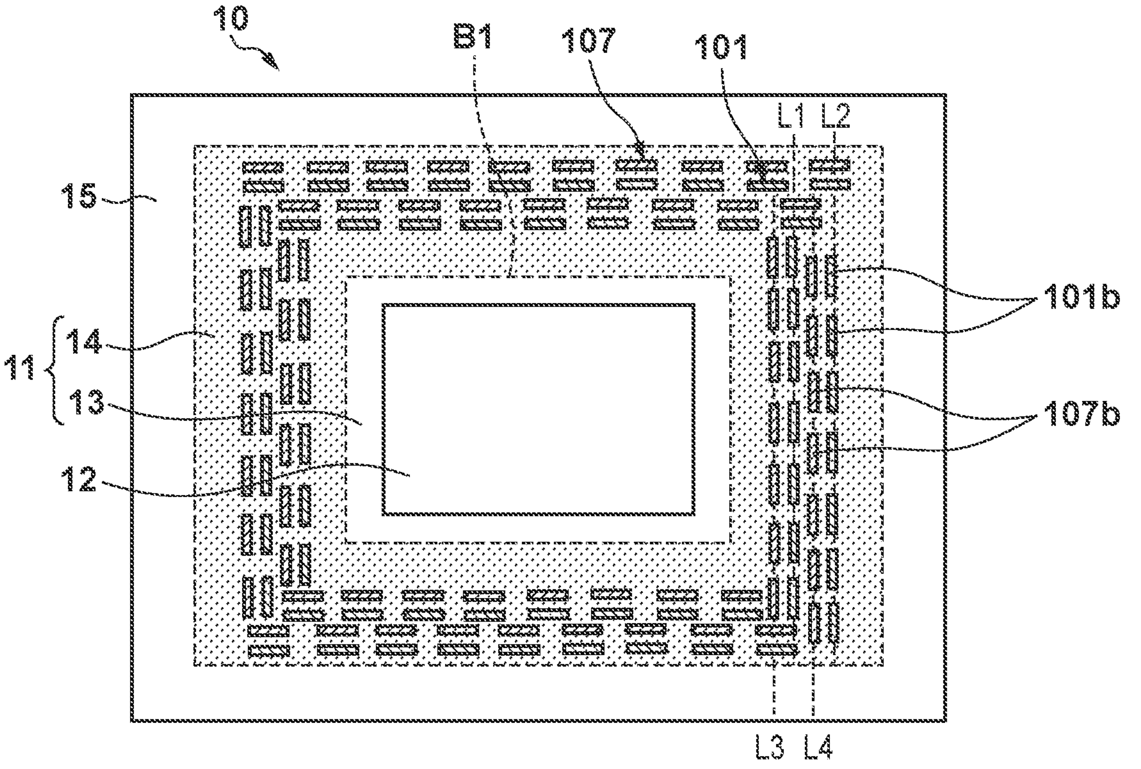

The layout of the first trench structures 101 and the second trench structures 107 provided in the first light-shielding region 14 will be described in detail next with reference to FIGS. 3A and 3B. FIGS. 3A and 3B are plan views each showing an orthogonal projection of the first trench structures 101 and the second trench structures 107 with respect to the surface 151 of the semiconductor layer 100.

FIG. 3A shows one layout example of the first trench structures 101 and the second trench structures 107. As described above, in an orthogonal projection with respect to the surface 151 of the semiconductor layer 100, the first trench structures 101 and the second trench structures 107 are arranged apart from each other. In the arrangement shown in FIG. 3A, the first trench structure 101 includes an extending portion 101*a* extending along one side of the boundary (virtual surface B1) between the first light-shielding region 14 and the second light-shielding region 13. Likewise, the second trench structure 107 includes an extending portion 107*a* extending along one side of the boundary (virtual surface B1) between the first light-shielding region 14 and the second light-shielding region 13. The extending portion 101*a* and the extending portion 107*a* each extend one end to the other end in the direction along the one side. In addition, in this embodiment, the first trench structures 101 and the second trench structures 107 continuously surround the boundary (virtual surface B1) between the first light-shielding region 14 and the second light-shielding region 13. With the arrangement of the first trench structures 101 and the second trench structures 107, in an orthogonal projection with respect to the virtual surface B1 at the boundary between the first light-shielding region 14 and the second light-shielding region 13, the overlapping portion O1 where the first trench structures 101 and the second trench structures 107 overlap each other surrounds the virtual surface B1. For example, the overlapping portion O1 can completely surround the virtual surface B1. This indicates that there is a light attenuating wall surrounding the virtual surface B1 at the boundary between the first light-shielding region 14 and the second light-shielding region 13. This can suppress stray light.

In addition, the first trench structures 101 and the second trench structures 107 do not extend through the semiconductor layer 100. Accordingly, as compared with the case in which the trench structures extending through the semiconductor layer 100 form the light attenuating wall, the strength of the semiconductor layer 100 can be held. This makes it possible to suppress stray light while suppressing a reduction in the non-defective product rate of the chips of the photoelectric conversion apparatuses 10, thereby suppressing a reduction in the quality of images obtained by the photoelectric conversion apparatus 10.

As described above, both the first trench structure 101 and the second trench structure 107 have DTI structures having the depths T1 and T2 each equal to or more than half the thickness D of the semiconductor layer 100. Assume that one of the first trench structures 101 and 107 has a shallow trench isolation (STI) structure. In this case, in order to implement the overlapping portion O1, the other trench structure needs to have a more depth. In general, an increase in the depth of a trench structure will increase variation in the depth of trench structures formed. If a trench structure is deepened due to such variation, the trench structure may extend through the semiconductor layer 100. If a trench structure extends through the semiconductor layer 100, the strength of the semiconductor layer 100 may not be held. In contrast, if trench structures become shallow due to the variation, the overlapping portion O1 may not be formed between trench structures each having a DTI structure and trench structures each having an STI structure. Therefore, making both the first trench structure 101 and the second trench structure 107 have DTI structures can form a light-shielding wall in the photoelectric conversion apparatus 10 with a high yield ratio.

In addition, the depth T1 of the first trench structure 101 and the depth T2 of the second trench structure 107 may satisfy the relation of 0.5≤(T1/T2)≤1.5. Furthermore, the depth T1 of the first trench structure 101 and the depth T2 of the second trench structure 107 may satisfy the relation of 0.8≤(T1/T2)≤1.2. This forms the overlapping portion O1 between the first trench structures 101 and the second trench structures 107 at a portion near the center of the semiconductor layer 100. When the overlapping portion O1 is formed at a portion near the surface 151 (or the surface 152) of the semiconductor layer 100, there is a high possibility that reflected light from the surface 152 (or the surface 151) of the semiconductor layer 100 sneaks through the overlapping portion O1. Providing the overlapping portion O1 at a portion near the center of the semiconductor layer 100 can reliably shut off stray light and further increase the effect of suppressing stray light.

FIG. 3B shows a layout example of the first trench structures 101 and the second trench structures 107, which is different from that shown in FIG. 3A. Like the arrangement shown in FIG. 3A, in an orthogonal projection with respect to the surface 151 of the semiconductor layer 100, the first trench structures 101 and the second trench structures 107 are arranged apart from each other. On the other hand, unlike the arrangement shown in FIG. 3A, the first trench structure 101 is constituted by a plurality of trench portions 101*b* arranged apart from each other. Likewise, the second trench structure 107 is constituted by a plurality of trench portions 107*b* arranged apart from each other. In this case, the plurality of trench portions 101*b* include a plurality of trenches arranged along one side of the boundary (virtual surface B1) between the first light-shielding region 14 and the second light-shielding region 13. In an orthogonal projection with respect to the virtual surface B1 at the boundary between the first light-shielding region 14 and the second light-shielding region 13, the plurality of trenches are continuously arranged from one end to the other end along the one side so as to make end portions of the plurality of trenches overlap. In addition, the plurality of trench portions 107*b* include a plurality of trenches arranged along one side of the boundary (virtual surface B1) between the first light-shielding region 14 and the second light-shielding region 13. In an orthogonal projection with respect to the virtual surface B1 at the boundary between the first light-shielding region 14 and the second light-shielding region 13, the plurality of trenches are continuously arranged from one end to the other end along the one side so as to make end portions of the plurality of trenches overlap.

More specifically, the first trench structures 101 include the trench portions 101*b* arranged apart from each other on lines L1 and L2 parallel to the boundary (virtual surface B1) between the first light-shielding region 14 and the second light-shielding region 13. In addition, the second trench structures 107 include the trench portions 107*b* arranged apart from each other on lines L3 and L4 parallel to the boundary (virtual surface B1) between the first light-shielding region 14 and the second light-shielding region 13. In this case, in an orthogonal projection with respect to the virtual surface B1 at the boundary between the first light-shielding region 14 and the second light-shielding region 13, the overlapping portions O1 formed by the trench portions 101*b* on the line L2 and the trench portions 107*b* on the line L4 are arranged in the gaps between the overlapping portions O1 formed by the trench portions 101*b* on the line L1 and the trench portions 107*b* on the line L3. In addition, in an orthogonal projection with respect to the virtual surface B1 at the boundary between the first light-shielding region 14 and the second light-shielding region 13, the overlapping portions O1 formed by the trench portions 101*b* on the line L1 and the trench portions 107*b* on the line L3 are arranged in the gaps between the overlapping portions O1 formed by the trench portions 101*b* on the line L2 and the trench portions 107*b* on the line L4. In this manner, the trench portions 101*b* of the first trench structures 101 complement each other, and the trench portions 107*b* of the second trench structures 107 complement each other. With this arrangement, the overlapping portions O1 where the first trench structures 101 and the second trench structures 107 overlap in an orthogonal projection with respect to the virtual surface B1 at the boundary between the first light-shielding region 14 and the second light-shielding region 13 can completely surround the virtual surface B1. For example, the overlapping portion O1 can completely surround the virtual surface B1. This indicates that there is a light attenuating wall surrounding the virtual surface B1 at the boundary between the first light-shielding region 14 and the second light-shielding region 13. As a result, stray light can be suppressed.

As compared with the arrangement shown in FIG. 3A, in the arrangement shown in FIG. 3B, the first trench structures 101 and the second trench structures 107 are not continuous but are spaced apart from each other and are respectively constituted by the plurality of trench portions 101*b* and the plurality of trench portions 107*b*. This can increase the strength of the semiconductor layer 100 more than the arrangement shown in FIG. 3A. Therefore, the arrangement shown in FIG. 3B can suppress stray light while further suppressing a reduction in the non-defective product rate of the chips of the photoelectric conversion apparatuses 10.

The first trench structures 101 and the second trench structures 107 may be used in a combination of the arrangements shown in FIGS. 3A and 3B. For example, one of the first trench structure 101 and the second trench structure may have an integral continuous arrangement as shown in FIG. 3A, and the other of the first trench structure 101 and the second trench structure may be constituted by trench portions spaced apart from each other as shown in FIG. 3B. Assume that in an orthogonal projection with respect to the virtual surface B1 at the boundary between the first light-shielding region 14 and the second light-shielding region 13, the region to which the first trench structures 101 and the second trench structures 107 are projected is a virtual region. Each arrangement is configured such that there is no straight path connecting between the first light-shielding region 14 and the second light-shielding region 13 without passing through the portion (overlapping portion O1) where the first trench structure 101 and the second trench structure 107 overlap each other in parallel with the surface 151 of the semiconductor layer 100 in the virtual region. With this arrangement, there is a continuous light attenuating wall surrounding the virtual surface B1 at the boundary between the first light-shielding region 14 and the second light-shielding region 13. As described above, in an orthogonal projection with respect to the virtual surface B1 at the boundary between the first light-shielding region 14 and the second light-shielding region 13, the overlapping portions O1 where the first trench structures 101 and the second trench structures 107 overlap each other continuously surround the second light-shielding region 13. This prevents light incident on an end portion of the semiconductor layer 100 or a region of the peripheral region 15 which is not light-shielded from becoming stray light and suppresses a reduction in the quality of an image obtained by the photoelectric conversion apparatus 10.

Figure 4A:
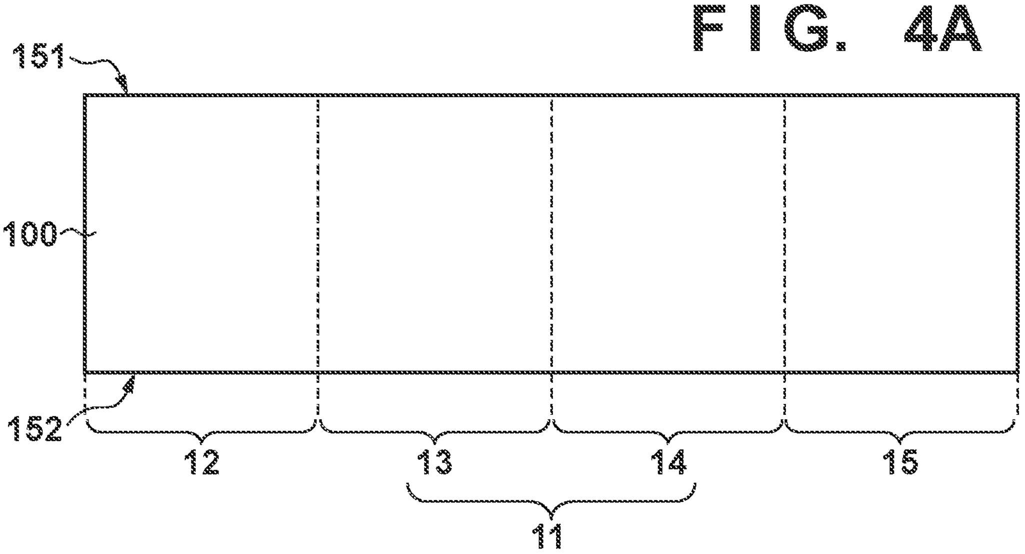
FIGS. 4A to 4C are views showing a method of manufacturing the photoelectric conversion apparatus in FIG. 1.

A method of manufacturing the photoelectric conversion apparatus 10 according to this embodiment will be described next with reference to FIGS. 4A to 7. First of all, as shown in FIG. 4A, a semiconductor substrate serving as the semiconductor layer 100 is prepared. The semiconductor substrate (semiconductor layer 100) includes the surface 151 and the surface 152 paired with the surface 151. In addition, the semiconductor substrate (semiconductor layer 100) includes the region provided with the pixel region 12, the first light-shielding region 14, the second light-shielding region 13, and the peripheral region 15 described above.

Figure 4B:
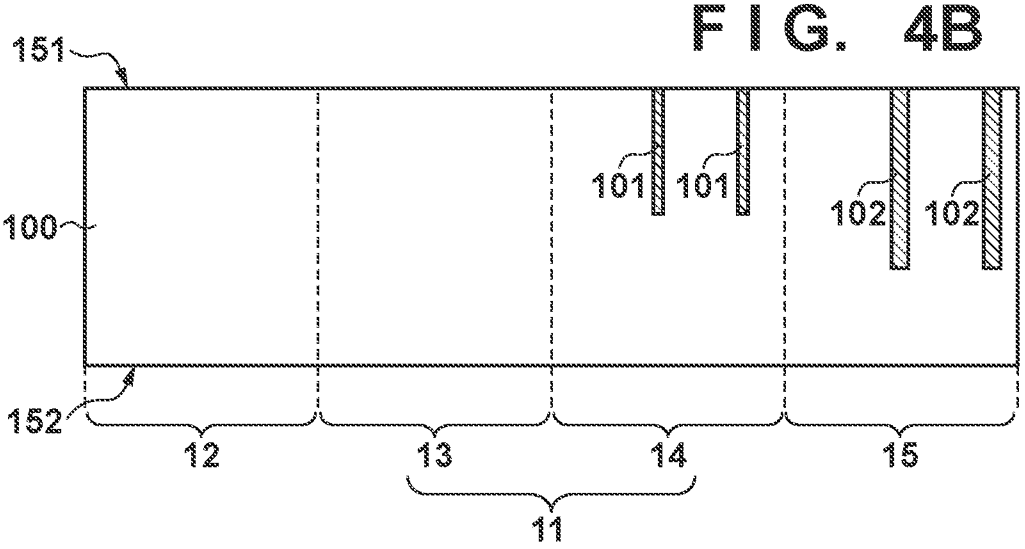

As shown in FIG. 4B, in the region serving as the first light-shielding region 14, the first trench structure 101 extending from the surface 151 of the semiconductor layer 100 toward the surface 152 is formed by using a process such as dry etching. The first trench structure 101 may be buried with an insulating film such as a silicon oxide film or silicon nitride film or a structure obtained by stacking these films. Alternatively, the first trench structure 101 may be buried with a stacked layer structure including an insulating film, epitaxial silicon, and polysilicon. Alternatively, the first trench structure 101 may be buried with a material as described above but may partly have voids. In other words, at least part of the first trench structure 101 may be buried with an insulating film, an insulating film and polysilicon, or an insulating film and epitaxial silicon. When polysilicon or epitaxial silicon is embedded in the first trench structure 101, polysilicon or epitaxial silicon can be provided in the interface with the semiconductor layer 100.

At the same time as the formation of the first trench structure 101, the pad separation trench structure 102 deeper than the first trench structure 101 may be formed in the region serving as the peripheral region 15. As a method of simultaneously forming the first trench structure 101 and the pad separation trench structure 102, there is available a method using a micro-loading effect at the time of dry etching. That is, making the width of the trench of the pad separation trench structure 102 larger than the width of the trench of the first trench structure 101 can form a deeper trench at the time of dry etching. Before or after the formation of the first trench structure 101 or the pad separation trench structure 102, an element separation structure such as a local oxidation of silicon (LOCOS) structure or STI structure may be formed in each region of the surface 151 (not shown). Part of the element separation structure may be formed to cap the surface 151 side of the first trench structure 101 or the pad separation trench structure 102.

Figure 4C:
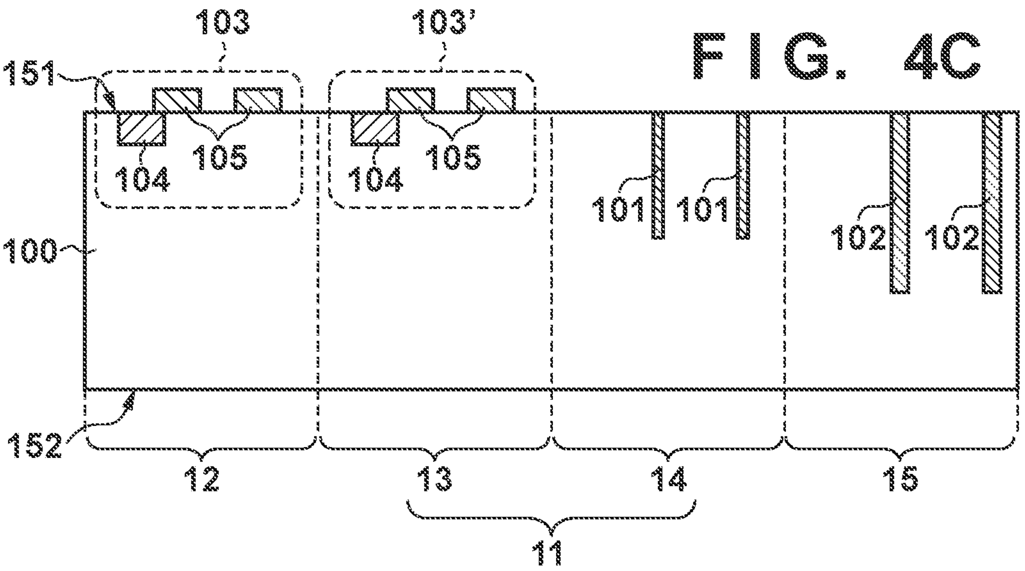

As shown in FIG. 4C, the photoelectric conversion elements 103 and 103' are formed in regions serving as the pixel region 12 and the second light-shielding region 13 on the surface 151 side of the semiconductor layer 100. The photoelectric conversion elements 103 and 103' each include the photodiode 104, and transistors 105 such as a transfer transistor, a reset transistor, a select transistor, and a source-follower transistor. The photoelectric conversion element 103' formed in the second light-shielding region 13 functions as an optical black pixel. Although not shown, in addition to the photoelectric conversion element 103', various types of elements constituting, for example, a driving circuit for driving the photoelectric conversion element 103 or 103' may be formed in the second light-shielding region 13. The elements constituting the photoelectric conversion elements 103 and 103' and the driving circuit can be manufactured by using a known semiconductor process. In this case, the elements constituting the photoelectric conversion element 103', the driving circuit, and the like need not be arranged in the first light-shielding region 14.

Figure 5A:
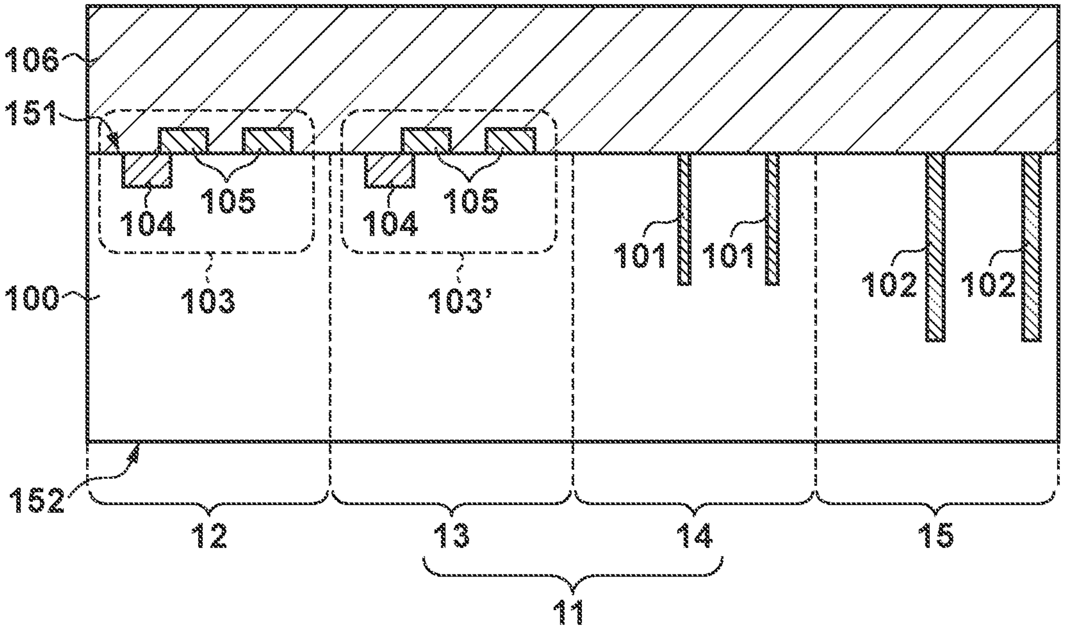
FIGS. 5A and 5B are views showing a method of manufacturing the photoelectric conversion apparatus in FIG. 1.

As shown in FIG. 5A, the structure 106 is formed so as to cover the surface 151 of the semiconductor layer 100. The structure 106 includes a wiring pattern and a dielectric interlayer. The structure 106 can be manufactured by using a known semiconductor process.

Figure 5B:
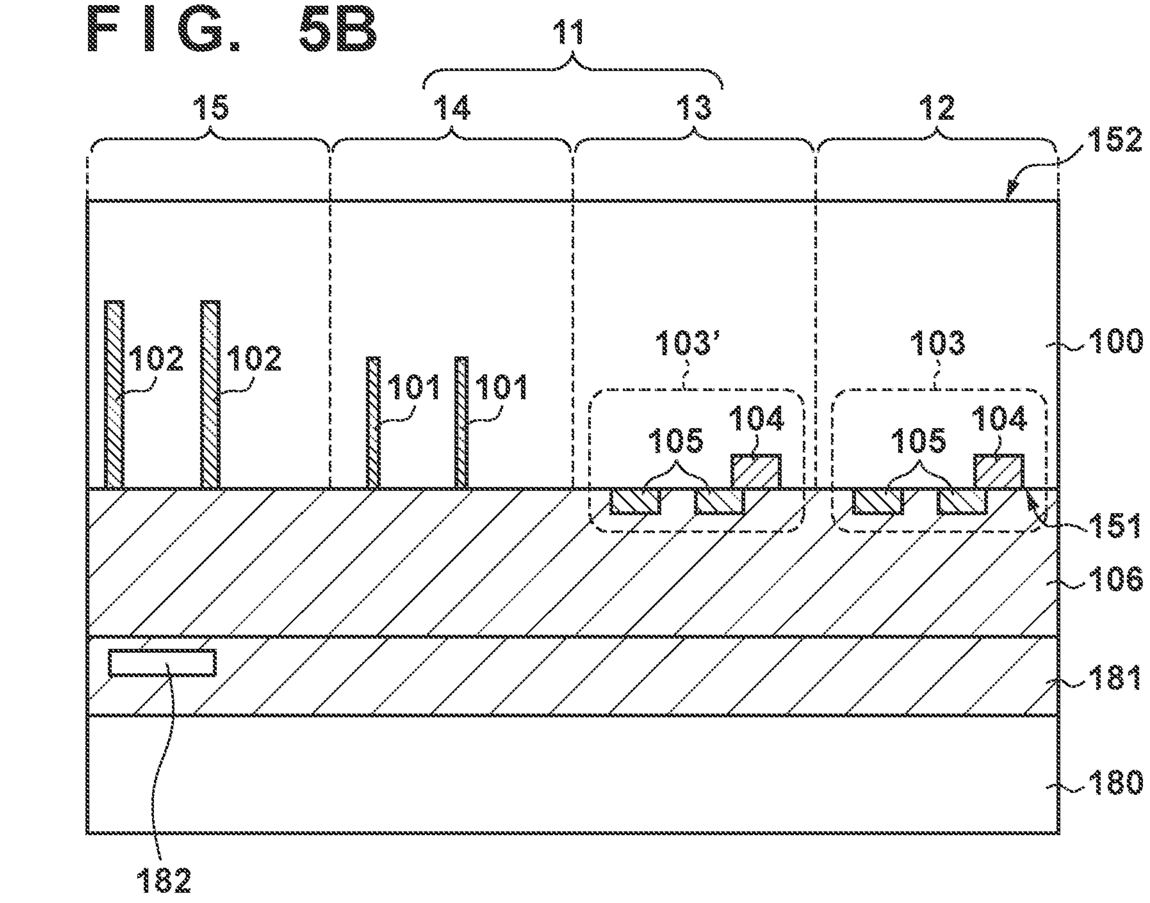

After the structure 106 is formed, the semiconductor layer 100 is joined to the support substrate 180 through the structures 106 and 181, as shown in FIG. 5B. The semiconductor layer 100 may be joined to the support substrate 180 by activating the structures 106 and 181 by plasma irradiation on the their surfaces, that is, a so-called cold joining method. However, this is not exhaustive. For example, the structure 106 may be joined to the structure 181 through a joining member having adhesiveness.

The support substrate 180 may be a substrate obtained by forming silicon oxide as the structure 181 on a silicon substrate. In this embodiment, however, as the support substrate 180, a substrate equipped with functions such as an ASIC and a memory is used. Accordingly, a wiring pattern, a dielectric interlayer, and the bonding pad 182 for connecting the photoelectric conversion apparatus 10 to the outside of the photoelectric conversion apparatus 10 are arranged in the structure 181.

Figure 6A:
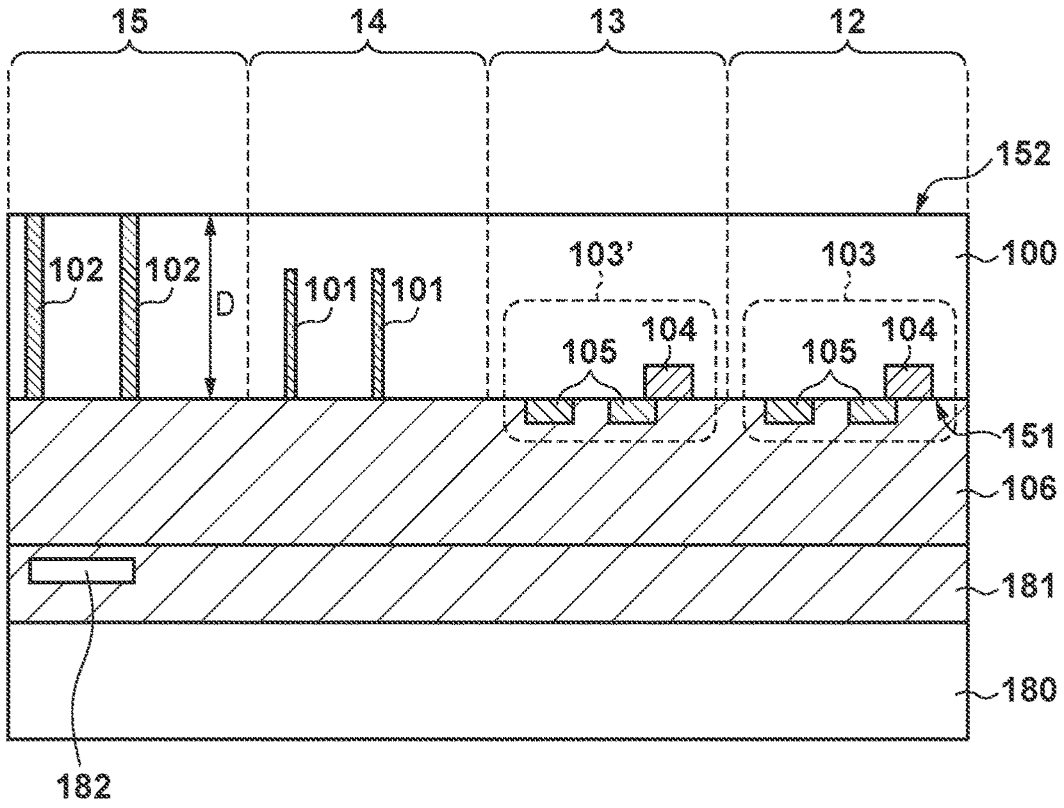
FIGS. 6A and 6B are views showing a method of manufacturing the photoelectric conversion apparatus in FIG. 1.

As shown in FIG. 6A, the semiconductor layer 100 is thinned from the surface 152 side to the thickness D. In this embodiment, the thickness D of the semiconductor layer 100 is assumed to be about 3 μm. However, for example, the thickness may be about 1 μm to 10 μm. The thickness D of the semiconductor layer 100 may be set as appropriate according to the specification of the photoelectric conversion apparatus 10 and the like. The semiconductor layer 100 can be thinned by using a grinder device, wet etching device, CMP device, or the like.

Figure 6B:
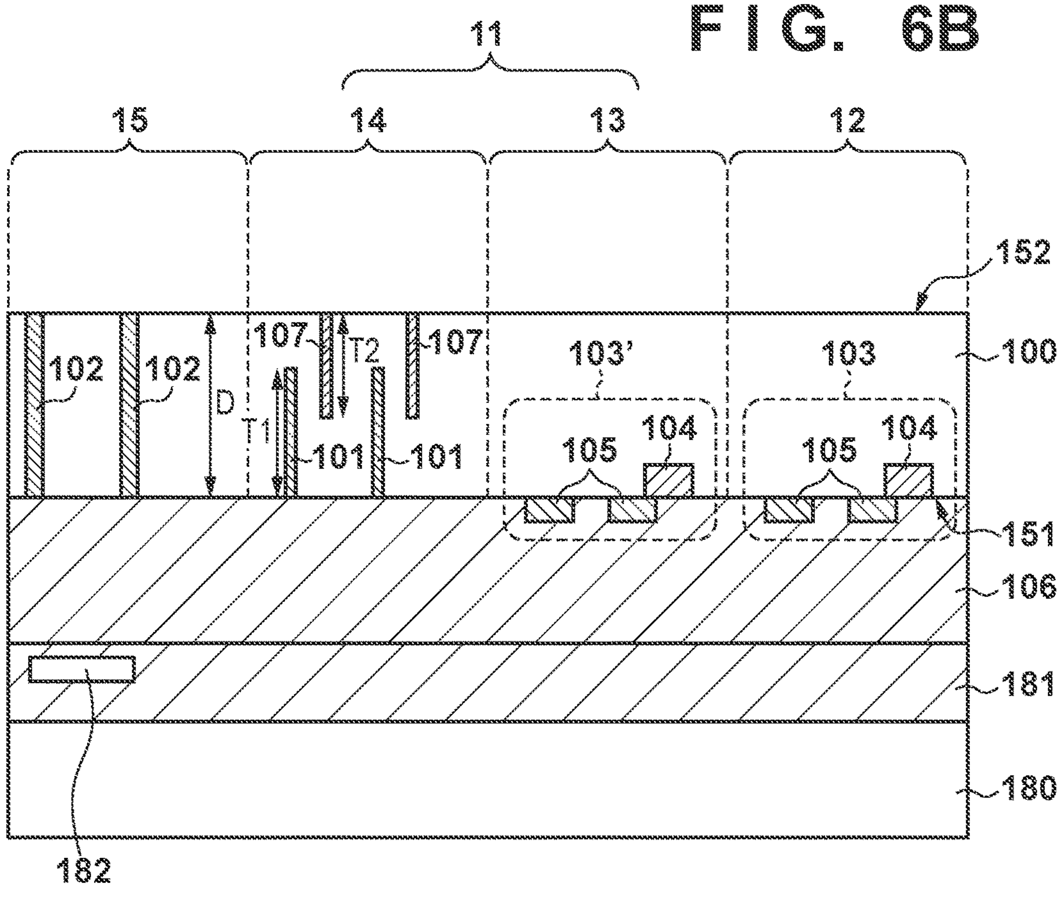

After the semiconductor layer 100 is thinned, the second trench structures 107 extending from the surface 152 of the semiconductor layer 100 toward the surface 151 are formed by using a process such as dry etching as shown in FIG. 6B. The second trench structure 107 may be buried with an insulating film formed from silicon oxide, silicon nitride, hafnium oxide, aluminum oxide, or tantalum oxide or a stacked layer structure of them. These insulating films can be formed so as to cover the surface 152 of the semiconductor layer 100 (not shown). The second trench structure 107 may be buried with a stacked layer structure of the above insulating film and a metal film formed from tungsten, aluminum, titanium, or the like. The second trench structure 107 is buried with a material as described above but may partly have voids. In other words, at least part of the second trench structure 107 may be buried with an insulating film or an insulating film and a metal film. When a metal film is embedded in the second trench structure 107, the metal film can be provided in the interface with the semiconductor layer 100.

In this case, the thickness D of the semiconductor layer 100, the depth T1 of the first trench structure 101, and the depth T2 of the second trench structure 107 satisfy $(D/2) \leq T1 < D$, $(D/2) \leq T2 < D$, and $D < (T1+T2)$, as described above.

Figure 7:
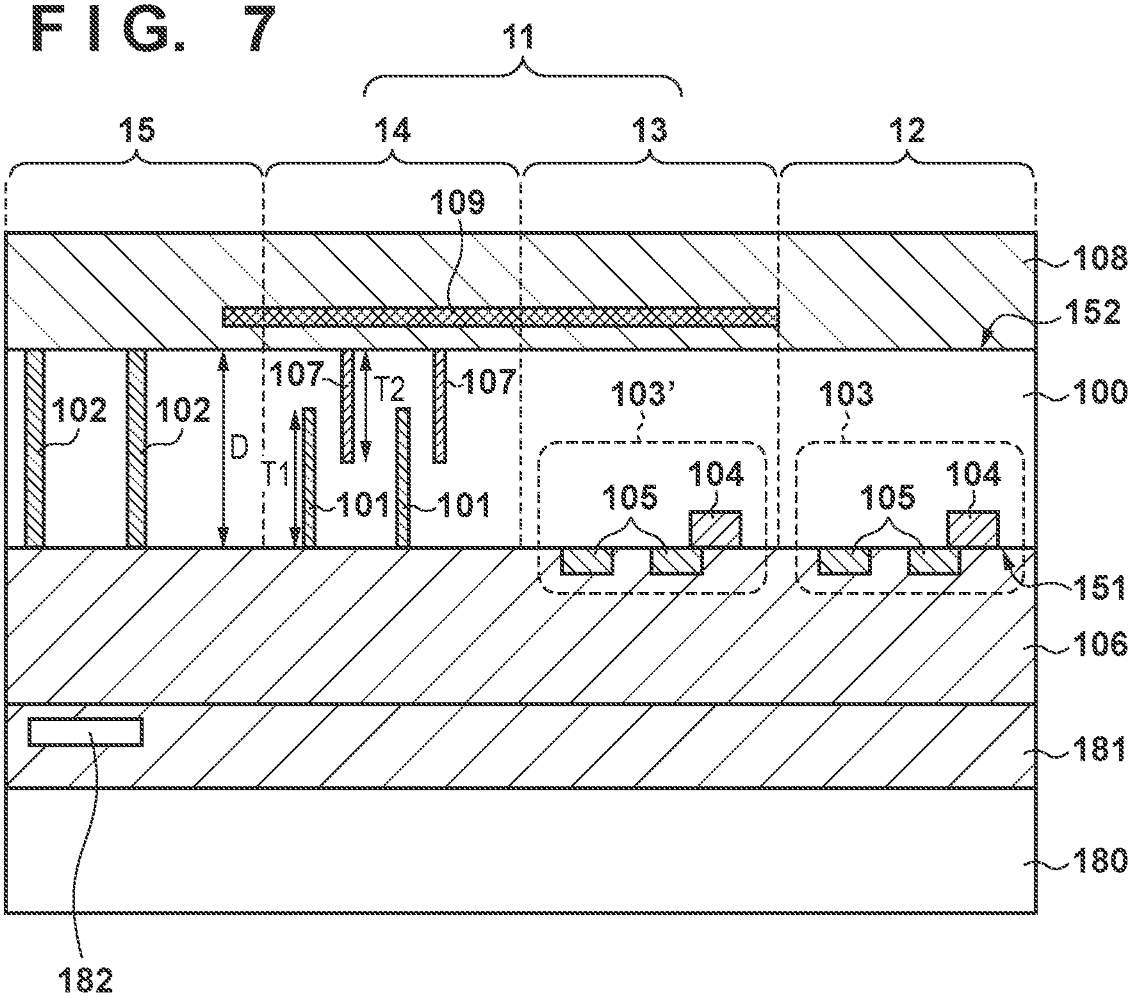
FIG. 7 is a view showing a method of manufacturing the photoelectric conversion apparatus in FIG. 1.

After the second trench structures 107 are formed, the structure 108 is formed so as to cover the surface 152 of the semiconductor layer 100, as shown in FIG. 7. The structure 108 includes an optical structure for guiding light from the surface of the structure 108 to the photodiode 104 via the surface 152 of the semiconductor layer 100. The structure 108 can include an intra-layer lens, a color filter, and a microlens as optical structures. The light-shielding layer 109 is formed near the surface 152 of the structure 108. In an orthogonal projection with respect to the surface 151 of the semiconductor layer 100, the light-shielding layer 109 is arranged so as to cover the entire of the first light-shielding region 14 and the second light-shielding region 13 and part of the peripheral region 15. A material such as tungsten, aluminum, or titanium nitride can be used for the light-shielding layer 109. The photoelectric conversion apparatus 10 shown in FIG. 2 is manufactured by forming the opening portion 183 from the surface of the structure 108 which is located on the surface 152 side of the semiconductor layer 100 to the bonding pad 182 so as to expose the bonding pad 182.

Figure 8:
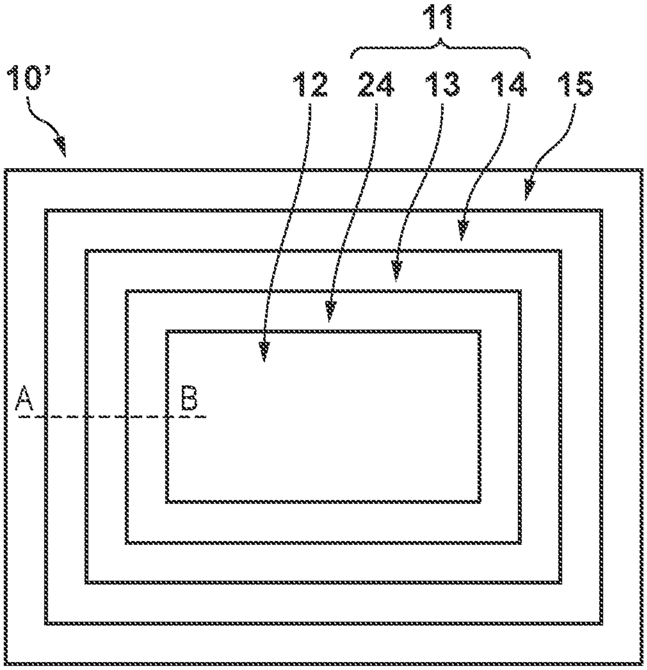
FIG. 8 is a plan view showing an example of the arrangement of the photoelectric conversion apparatus according to this embodiment.
Figure 9:
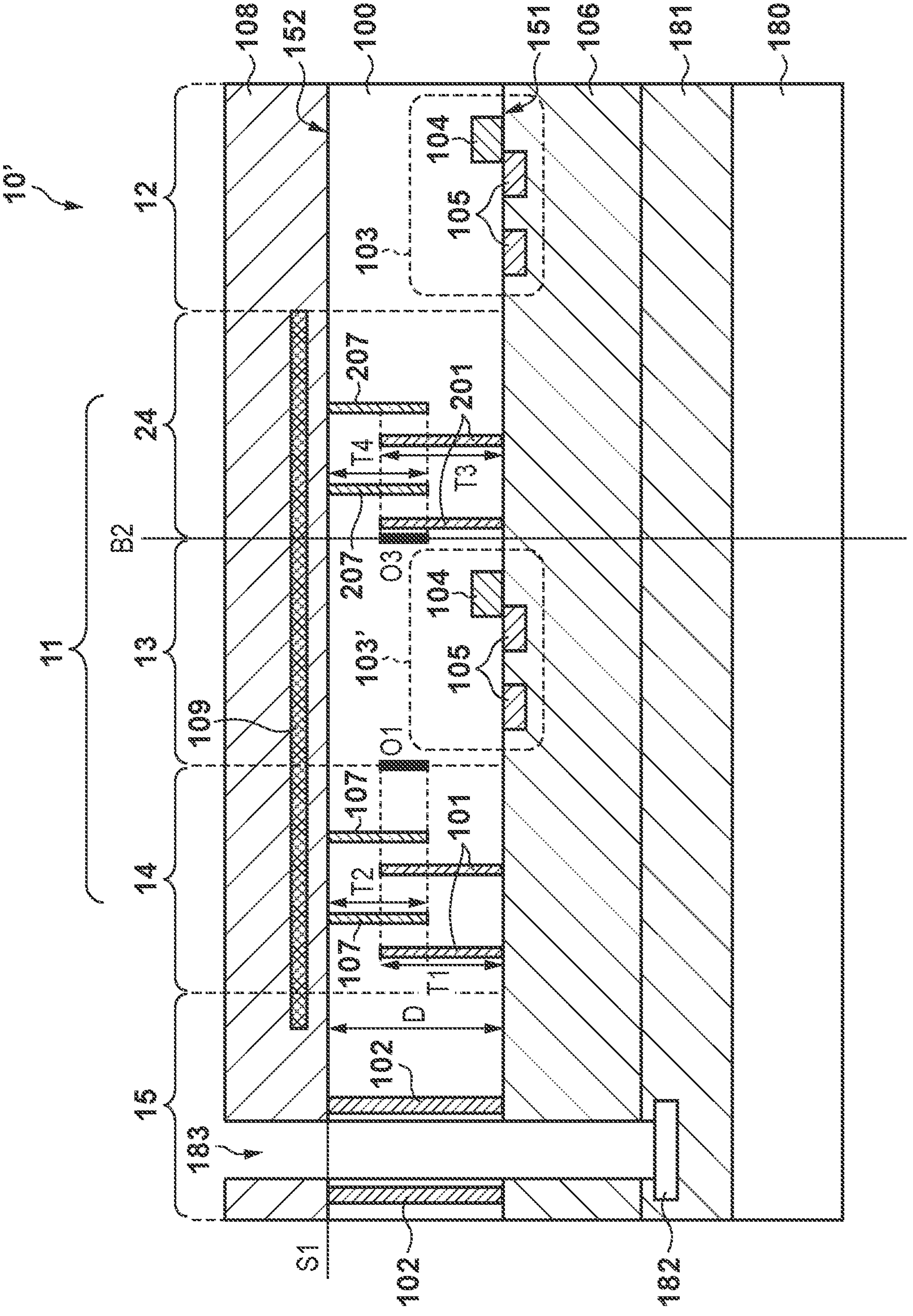
FIG. 9 is a sectional view showing an example of the arrangement of the photoelectric conversion apparatus in FIG. 8.

A modification of the photoelectric conversion apparatus 10 described above will be described next. FIG. 8 is a plan view showing the schematic arrangement of a photoelectric conversion apparatus 10' according to this embodiment. FIG. 9 is a sectional view taken along A-B shown in FIG. 8.

The comparison between the photoelectric conversion apparatus 10 and the photoelectric conversion apparatus 10' indicates that the semiconductor layer 100 is provided with third trench structures 201 and fourth trench structures 207 in the light-shielding region 11, and a third light-shielding region 24 is additionally provided between the second light-shielding region 13 and the pixel region 12. Since this arrangement is similar to that of the photoelectric conversion apparatus 10 described above except for the third light-shielding region 24, the third light-shielding region 24 will be described below.

The third trench structures 201 and the fourth trench structures 207 are arranged in third light-shielding region 24. The photoelectric conversion element 103' may be arranged in the third light-shielding region 24. Like the first trench structure 101, the third trench structure 201 extends from the surface 151 of the semiconductor layer 100 toward the surface 152. Like the second trench structure 107, the fourth trench structure 207 extends from the surface 152 toward the surface 151. In this case, let T3 be the depth from the surface 151 of the third trench structure 201 and T4 be the depth from the surface 152 of the fourth trench structure 207. At this time, the thickness D of the semiconductor layer 100 and the depths T3 and T4 satisfy the relations of $(D/2) \leq T3 < D$ and $(D/2) \leq T4 < D$. Although a detailed layout example will be described later, as can be understood from FIG. 9, in an orthogonal projection with respect to the surface 151 of the semiconductor layer 100, the third trench structures 201 and the fourth trench structures 207 are arranged apart from each other. In addition, in an orthogonal projection with respect to a virtual surface B2 that is orthogonal to the surface 151 of the semiconductor layer 100 and extends along the boundary between the second light-shielding region 13 and the third light-shielding region 24, the third trench structures 201 and the fourth trench structures 207 overlap each other at least partly. In other words, the thickness D and the depths T3 and T4 satisfy the relation of $D < (T3 + T4)$.

Figure 10A:
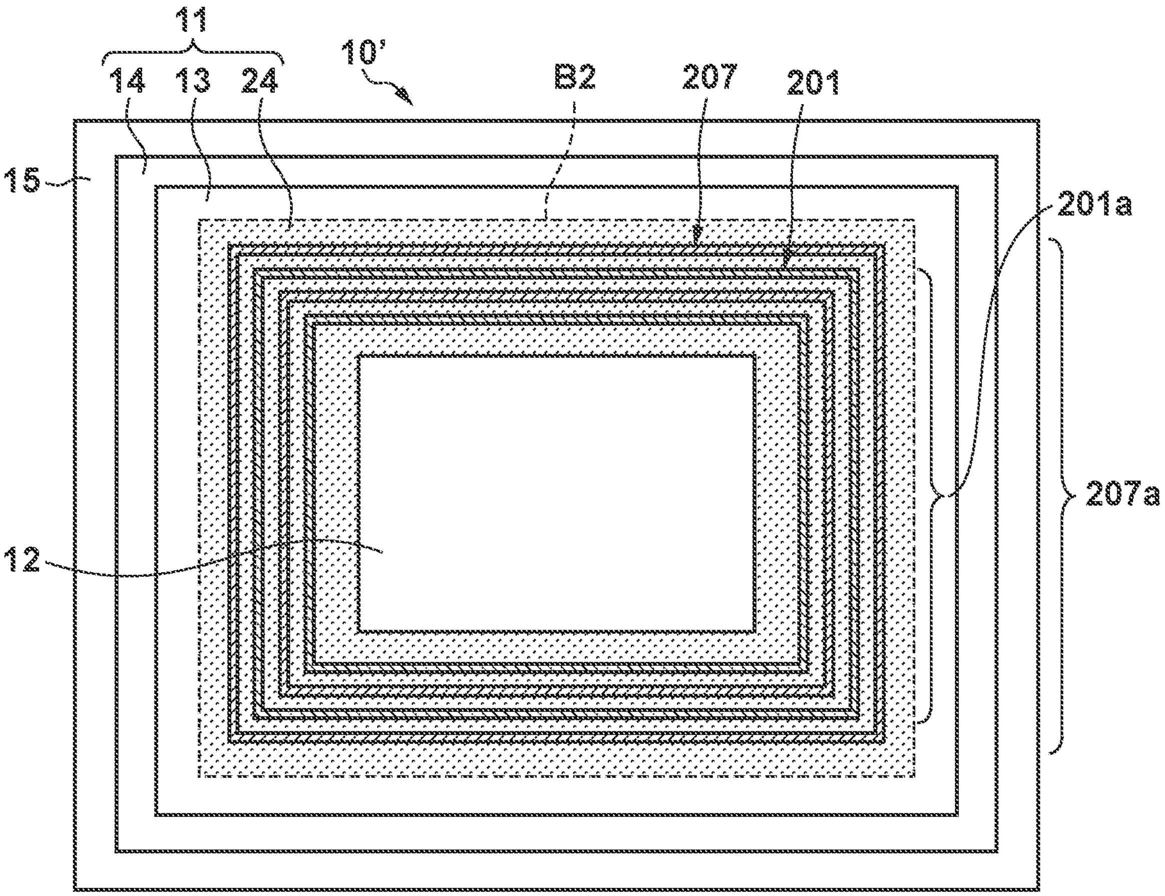
FIGS. 10A and 10B are views each showing a layout example of the trench structures of the photoelectric conversion apparatus in FIG. 8.
Figure 10B:
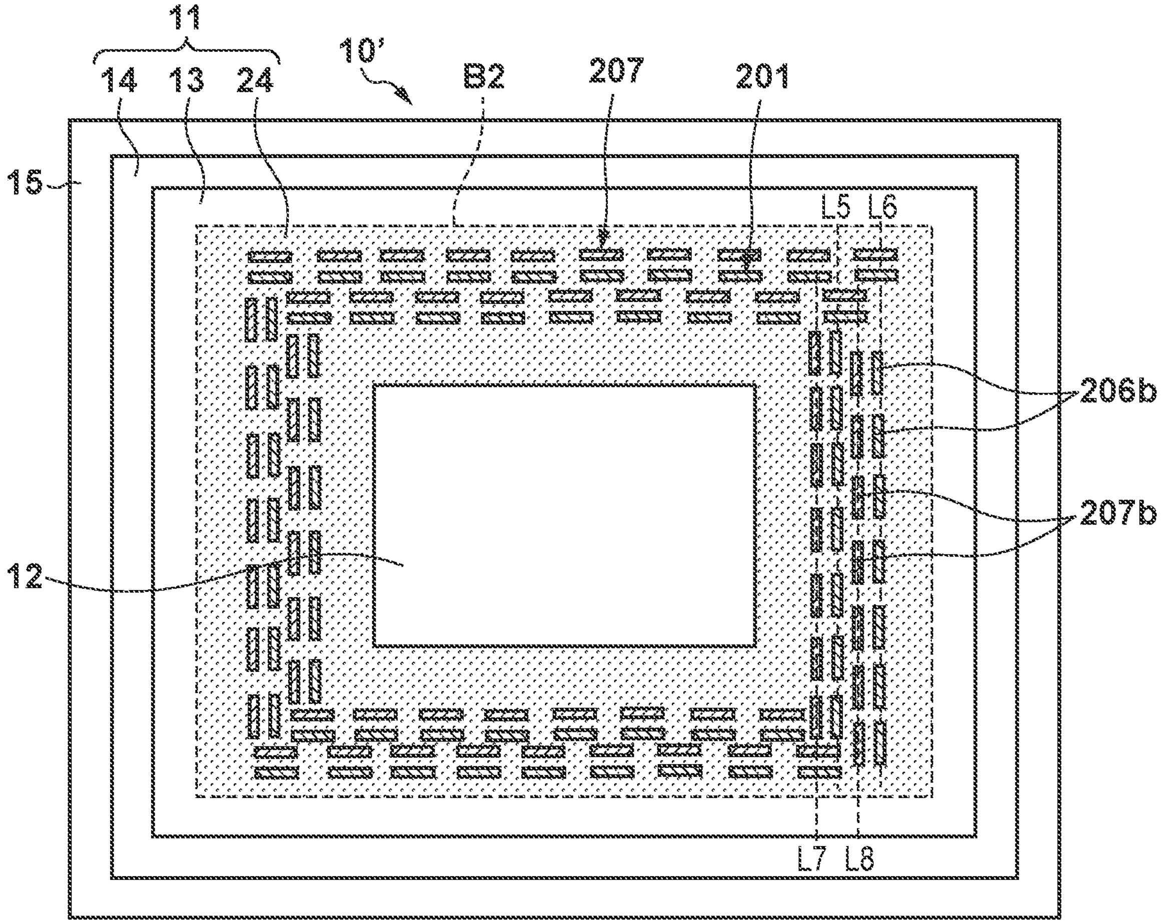

The layout of the third trench structures 201 and the fourth trench structures 207 provided in the third light-shielding region 24 will be described in detail next with reference to FIGS. 10A and 10B. FIGS. 10A and 10B are plan views each showing an orthogonal projection of the third trench structures 201 and the fourth trench structures 207 with respect to the surface 151 of the semiconductor layer 100.

FIG. 10A shows one layout example of the third trench structures 201 and the fourth trench structures 207. As described above, in an orthogonal projection with respect to the surface 151 of the semiconductor layer 100, the third trench structures 201 and the fourth trench structures 207 are arranged apart from each other. In the arrangement shown in FIG. 10A, the third trench structure 201 includes an extending portion 201*a* extending along one side of the boundary (virtual surface B2) between the second light-shielding region 13 and the third light-shielding region 24. Likewise, the fourth trench structure 207 includes an extending portion 207*a* extending along one side of the boundary (virtual surface B2) between the second light-shielding region 13 and the third light-shielding region 24. The extending portion 101*a* and the extending portion 107*a* each extend from one end to the other end in the direction along the one side. In addition, in this embodiment, the third trench structure 201 and the fourth trench structure 207 continuously surround the boundary (virtual surface B2) between the second light-shielding region 13 and the third light-shielding region 24. With the arrangement of the third trench structures 201 and the fourth trench structures 207, in an orthogonal projection with respect to the virtual surface B2 at the boundary between the second light-shielding region 13 and the third light-shielding region 24, an overlapping portion O2 where the third trench structures 201 and the fourth trench structures 207 overlap each other surrounds the virtual surface B2. For example, the overlapping portion O2 can completely surround the virtual surface B2. This indicates that there is a light attenuating wall surrounding the virtual surface B2 at the boundary between the second light-shielding region 13 and the third light-shielding region 24. This can suppress stray light.

As compared with the photoelectric conversion apparatus 10, the photoelectric conversion apparatus 10' can suppress stray light incident from the pixel region 12 side onto the second light-shielding region 13. That is, the accuracy of dark noise components improves when the differences between signals output from the photoelectric conversion elements 103 in the pixel region 12 and the photoelectric conversion elements 103' in the second light-shielding region 13 are used, thereby enabling accurate photographing. This makes it possible to suppress a reduction in the quality of an image obtained by the photoelectric conversion apparatus 10' more than the photoelectric conversion apparatus 10.

FIG. 10B shows a layout example of the third trench structures 201 and the fourth trench structures 207, which is different from that shown in FIG. 10A. Like the arrangement shown in FIG. 10A, in an orthogonal projection with respect to the surface 151 of the semiconductor layer 100, the third trench structures 201 and the fourth trench structures 207 are arranged apart from each other. On the other hand, unlike the arrangement shown in FIG. 10A, the third trench structure 201 is constituted by a plurality of trench portions 201*b* arranged apart from each other. Likewise, the fourth trench structure 207 is constituted by a plurality of trench portions 207*b* arranged apart from each other. In this case, the plurality of trench portions 201*b* include a plurality of trenches arranged along one side of the boundary (virtual surface B2) between the second light-shielding region 13 and the third light-shielding region 24. In an orthogonal projection with respect to the virtual surface B2 at the boundary between the second light-shielding region 13 and the third light-shielding region 24, the plurality of trenches are continuously arranged from one end to the other end along the one side so as to make end portions of the plurality of trenches overlap. In addition, the plurality of trench portions 207*b* include a plurality of trenches arranged along one side of the boundary (virtual surface B2) between the second light-shielding region 13 and the third light-shielding region 24. In an orthogonal projection with respect to the virtual surface B2 at the boundary between the second light-shielding region 13 and the third light-shielding region 24, the plurality of trenches are continuously arranged from one end to the other end along the one side so as to make end portions of the plurality of trenches overlap.

More specifically, the third trench structures 201 include the trench portions 201*b* arranged apart from each other on lines L5 and L6 parallel to the boundary (virtual surface B2) between the second light-shielding region 13 and the third light-shielding region 24. In addition, the fourth trench structures 207 include the trench portions 207*b* arranged apart from each other on lines L7 and L8 parallel to the boundary (virtual surface B2) between the second light-shielding region 13 and the third light-shielding region 24. In this case, in an orthogonal projection with respect to the virtual surface B2 at the boundary between the second light-shielding region 13 and the third light-shielding region 24, the overlapping portions O2 formed by the trench portions 201*b* on the line L6 and the trench portions 207*b* on the line L8 are arranged in the gaps between the overlapping portions O2 formed by the trench portions 201*b* on the line L5 and the trench portions 207*b* on the line L7. In addition, in an orthogonal projection with respect to the virtual surface B2 at the boundary between the second light-shielding region 13 and the third light-shielding region 24, the overlapping portions O2 formed by the trench portions 201*b* on the line L5 and the trench portions 207*b* on the line L7 are arranged in the gaps between the overlapping portions O2 formed by the trench portions 201*b* on the line L6 and the trench portions 207*b* on the line L8. In this manner, the trench portions 201*b* of the third trench structure 201 complement each other, and the trench portions 207*b* of the fourth trench structure 207 complement each other. With this arrangement, the overlapping portions O2 where the third trench structure 201 and the fourth trench structure 207 overlap in an orthogonal projection with respect to the virtual surface B2 at the boundary between the second light-shielding region 13 and the third light-shielding region 24 can surround the virtual surface B2. For example, the overlapping portions O2 completely surround the virtual surface B2. This indicates that there is a light attenuating wall surrounding the virtual surface B2 at the boundary between the second light-shielding region 13 and the third light-shielding region 24. As a result, the photoelectric conversion apparatus 10' can suppress stray light incident from the pixel region 12 side onto the second light-shielding region 13 more than the photoelectric conversion apparatus 10.

As described above, the third trench structures 201 and the fourth trench structures 207 are provided between the second light-shielding region 13 provided with the photoelectric conversion elements 103' and the pixel region 12. The third trench structure 201 may have a structure similar to the first trench structure 101 described above. In addition, the fourth trench structure 207 may have a structure similar to the second trench structure 107 described above.

Accordingly, variation in the first trench structure 101 and the second trench structure 107 described above may also be applied to the third trench structure 201 and the fourth trench structure 207 as needed.

The above embodiment has exemplified the case in which the overlapping portions O1 where the first trench structures 101 and the second trench structures 107 overlap each other surround the virtual surface B1 in an orthogonal projection with respect to the virtual surface B1 at the boundary between the first light-shielding region 14 and the second light-shielding region 13. However, this is not exhaustive. In an orthogonal projection with respect to the virtual surface B1, the overlapping portions O1 where the first trench structures 101 and the second trench structures 107 overlap each other are provided in part of the virtual surface B1 to form a light attenuating wall, thereby suppressing stray light incident from the region. This suppresses a reduction in the quality of images obtained by the photoelectric conversion apparatuses 10 and 10'. Likewise, in an orthogonal projection with respect to the virtual surface B2 at the boundary between the second light-shielding region 13 and the third light-shielding region 24, the overlapping portions O2 where the third trench structures 201 and the fourth trench structures 207 overlap each other may be provided in part of the virtual surface B2.

As has been described above, the first trench structures 101 and the second trench structures 107, each having the DTI structure, are provided on the surface 151 and the surface 152 of the semiconductor layer 100 on the outside of the second light-shielding region 13 in which the photoelectric conversion elements 103' are arranged. This arrangement can suppress the influence of stray light and a reduction in the quality of images obtained by the photoelectric conversion apparatus 10 while suppressing a reduction in the strength of the semiconductor layer 100 as compared with the arrangement provided with the trench structures extending through the semiconductor layer 100. In addition, the third trench structures 201 and the fourth trench structures 207 respectively having structures similar to the first trench structures 101 and the second trench structures 107 are provided between the second light-shielding region 13 and the pixel region 12. This arrangement can further suppress the influence of stray light and a reduction in the quality of images obtained by the photoelectric conversion apparatus 10.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-144167, filed Sep. 3, 2021, which is hereby incorporated by reference herein in its entirety.

What is claimed is:

1. A photoelectric conversion apparatus comprising a semiconductor layer arranged with a pixel region including a plurality of photoelectric conversion elements and a light-shielding region light-shielded by a light-shielding layer, wherein the light-shielding region includes a first light-shielding region having a first trench structure and a second trench structure provided in the semiconductor layer and a second light-shielding region arranged between the first light-shielding region and the pixel region, the semiconductor layer includes a first surface and a second surface on an opposite side to the first surface, the first trench structure extends from the first surface toward the second surface, the second trench structure extends from the second surface toward the first surface, relations of $(D/2) \leq T1 < D$ and $(D/2) \leq T2 < D$ are satisfied, where T1 is a depth from the first surface of the first trench structure, T2 is a depth from the second surface of the second trench structure, and D is a thickness of the semiconductor layer, the first trench structure and the second trench structure are arranged apart from each other in an orthogonal projection with respect to the first surface, the first trench structure and the second trench structure overlap at least partly in an orthogonal projection orthogonal to the first surface and provided with respect to a virtual surface along a boundary between the first light-shielding region and the second light-shielding region, in an orthogonal projection with respect to the first surface, the second light-shielding region surrounds the pixel region, and the first light-shielding region surrounds the second light-shielding region, and in an orthogonal projection with respect to the virtual surface, a portion where the first trench structure and the second trench structure overlap each other continuously surrounds the second light-shielding region.

2. The apparatus according to claim 1, wherein a relation of $0.5 \leq (T1/T2) \leq 1.5$ is further satisfied.

3. The apparatus according to claim 1, wherein at least one of the first trench structure and the second trench structure includes an extending portion extending along one side of the boundary, and the extending portion is continuous from one end to another end along the one side.

4. The apparatus according to claim 1, wherein at least one of the first trench structure and the second trench structure is configured from a plurality of trench portions arranged apart from each other.

5. The apparatus according to claim 4, wherein the plurality of trench portions include a plurality of trenches arranged along one side of the boundary, and the plurality of trenches are continuously arranged from one end to the other end along the one side so as to make end portions of the plurality of trenches overlap each other in an orthogonal projection with respect to the virtual surface.

6. The apparatus according to claim 1, wherein if a region onto which the first trench structure and the second trench structure are projected in an orthogonal projection with respect to the virtual surface is a virtual region, there is no straight path connecting between the first light-shielding region and the second light-shielding region without passing through a portion where the first trench structure and the second trench structure overlap each other in parallel with the first surface at a height at which a portion of the virtual region where the first trench structure and the second trench structure overlap each other is arranged.

7. The apparatus according to claim 1, wherein at least part of the first trench structure is buried with an insulating film, an insulating film and polysilicon, or an insulating film and epitaxial silicon.

8. The apparatus according to claim 1, wherein at least part of the second trench structure is buried with an insulating film or an insulating film and a metal film.

9. The apparatus according to claim 1, wherein the first trench structure and the second trench structure have a DTI deep trench isolation (DTI) structure.

10. The apparatus according to claim 1, wherein the light-shielding region further includes a third light-shielding region arranged between the second light-shielding region and the pixel region, with a third trench structure and a fourth trench structure being provided in the semiconductor layer, the third trench structure extends from the first surface toward the second surface, the fourth trench structure extends from the second surface toward the first surface, relations of $(D/2) \leq T3 < D$ and $(D/2) \leq T4 < D$ are satisfied, where T3 is a depth from the first surface of the third trench structure and T4 is a depth from the second surface of the fourth trench structure, the third trench structure and the fourth trench structure are arranged apart from each other in an orthogonal projection with respect to the first surface, and the third trench structure and the fourth trench structure overlap at least partly in an orthogonal projection orthogonal to the first surface and provided with respect to a virtual surface along a boundary between the second light-shielding region and the third light-shielding region.

11. The apparatus according to claim 10, wherein the third trench structure and the fourth trench structure have a DTI deep trench isolation (DTI) structure.

12. The apparatus according to claim 1, wherein the plurality of photoelectric conversion elements are arranged on the first surface, and the light-shielding layer is arranged so as to cover the second surface.

13. The apparatus according to claim 1, wherein the second light-shielding region is provided with a photoelectric conversion element different from the plurality of photoelectric conversion elements, or a photoelectric conversion element different from the plurality of photoelectric conversion elements and a driving circuit configured to drive the plurality of photoelectric conversion elements.

14. The apparatus according to claim 1, wherein the semiconductor layer is further arranged with a peripheral region, at least part of which is not covered with the light-shielding layer, between an end portion of the semiconductor layer and the second light-shielding region, the peripheral region is provided with a bonding pad, the second surface is provided with an opening portion for exposing the bonding pad, the first surface is provided with a pad separation trench structure between the opening portion and at least one of the first trench structure and the second trench structure, a depth from the first surface of the pad separation trench structure is deeper than the depth from the first surface of the first trench structure (T1) and is deeper than the depth from the second surface of the second trench structure (T2), and a width of the pad separation trench structure is larger than a width of the first trench structure.

15. The apparatus according to claim 14, wherein the pad separation trench structure extends from the first surface to the second surface.

16. A method of manufacturing a photoelectric conversion apparatus including a semiconductor layer arranged with a pixel region including a plurality of photoelectric conversion elements and a light-shielding region light-shielded by a light-shielding layer, the method comprising:

forming a first trench structure extending from a first surface of the semiconductor layer toward a second surface on an opposite side to the first surface; and forming a second trench structure extending from the second surface toward the first surface, wherein the light-shielding region includes a first light-shielding region having the first trench structure and a second trench structure provided in the semiconductor layer, and a second light-shielding region provided between the first light-shielding region and the pixel region, relations of $(D/2) \leq T1 < D$ and $(D/2) \leq T2 < D$ are satisfied, where T1 is a depth from the first surface of the first trench structure, T2 is a depth from the second surface of the second trench structure, and D is a thickness of the semiconductor layer, the first trench structure and the second trench structure are arranged apart from each other in an orthogonal projection with respect to the first surface, the first trench structure and the second trench structure overlap at least partly in an orthogonal projection orthogonal to the first surface and provided with respect to a virtual surface along a boundary between the first light-shielding region and the second light-shielding region, in an orthogonal projection with respect to the first surface, the second light-shielding region surrounds the pixel region, and the first light-shielding region surrounds the second light-shielding region, and in an orthogonal projection with respect to the virtual surface, a portion where the first trench structure and the second trench structure overlap each other continuously surrounds the second light-shielding region.

17. The method according to claim 16, further comprising forming a third trench structure extending from the first surface toward the second surface and a fourth trench structure extending from the second surface toward the first surface in a third light-shielding region of the light-shielding region which is located between the second light-shielding region and the pixel region, wherein relations of $(D/2) \leq T3 < D$ and $(D/2) \leq T4 < D$ are satisfied, where T3 is a depth from the first surface of the third trench structure and T4 is a depth from the second surface of the fourth trench structure, the third trench structure and the fourth trench structure are arranged apart from each other in an orthogonal projection with respect to the first surface, and the third trench structure and the fourth trench structure overlap at least partly in an orthogonal projection orthogonal to the first surface and provided with respect to a virtual surface along a boundary between the second light-shielding region and the third light-shielding region.

* * * * *